US009275724B2

(12) United States Patent
Wu et al.

(10) Patent No.: US 9,275,724 B2
(45) Date of Patent: *Mar. 1, 2016

(54) METHOD OF WRITING TO AND READING DATA FROM A THREE-DIMENSIONAL TWO PORT REGISTER FILE

(71) Applicant: TAIWAN SEMICONDUCTOR MANUFACTURING COMPANY, LTD., Hsinchu (TW)

(72) Inventors: Ching-Wei Wu, Caotun Town (TW); Jui-Che Tsai, Tainan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/666,373

(22) Filed: Mar. 24, 2015

(65) Prior Publication Data

US 2015/0194206 A1 Jul. 9, 2015

Related U.S. Application Data

(63) Continuation of application No. 14/069,411, filed on Nov. 1, 2013, now Pat. No. 9,001,611.

(51) Int. Cl.

| | |
|---|---|
| ***G11C 8/00*** | (2006.01) |
| ***G11C 11/418*** | (2006.01) |
| ***G11C 7/18*** | (2006.01) |
| ***G11C 11/419*** | (2006.01) |
| *G11C 13/00* | (2006.01) |
| *G11C 11/412* | (2006.01) |

(52) U.S. Cl.

CPC ................ *G11C 11/418* (2013.01); *G11C 7/18* (2013.01); *G11C 11/419* (2013.01); *G11C 11/412* (2013.01); *G11C 13/0023* (2013.01)

(58) Field of Classification Search

CPC ............. G11C 13/0069; G11C 11/419; G11C 11/412; G11C 13/0023; G11C 2213/71; G11C 11/415; G11C 11/418; G11C 16/08; G11C 7/1096; G11C 7/22; G11C 11/1653; G11C 11/409

USPC ................. 365/230.06, 230.05, 189.011, 154

See application file for complete search history.

(56) References Cited

U.S. PATENT DOCUMENTS

| | | | | |
|---|---|---|---|---|
| 8,279,704 | B2 * | 10/2012 | Scheuerlein et al. | 365/230.06 |
| 8,305,836 | B2 | 11/2012 | Nii | |
| 9,001,611 | B1 * | 4/2015 | Wu et al. | 365/230.06 |

OTHER PUBLICATIONS

Ishikura, S., et al., "A 45nm 2port 8T-SRAM Using Hierarchical Replica Bitine Technique with Immunity from Simultaneous R/W Access Issues", 2007 Symposium on VLSI Circuits Digest of Technical Papers, pp. 254-255.

Honda, Kentaro, et al., "Elimination of Half Select Disturb in 8T-SRAM by Local Injected Electron Asymmetric Pass Gate Transistor", 2010 IEEE, 4 pages.

* cited by examiner

*Primary Examiner* — David Lam

(74) *Attorney, Agent, or Firm* — Hauptman Ham, LLP

(57) ABSTRACT

A method comprises selecting a memory cell included in a memory cell array in which data is to be stored. The memory cell array is connected with a logic gate array. The memory cells of the memory cell array are individually coupled with a corresponding logic gate of the logic gate array by a separate word line output. The method also comprises communicating a write row output signal to the logic gate array. The write row output signal is communicated from a write address row decoder to the logic gate array. The write address row decoder has a plurality of write row outputs coupled with the logic gate array. The method further comprises communicating a write column output signal to the logic gate array. The write column output signal is communicated from a write address column decoder to the logic gate array.

20 Claims, 5 Drawing Sheets

500
518
520
504'
516
504
514
506
522
508
502
528
526
524
512
510

METHOD OF WRITING TO AND READING DATA FROM A THREE-DIMENSIONAL TWO PORT REGISTER FILE

PRIORITY CLAIM

The present application is a continuation of U.S. application Ser. No. 14/069,411, filed Nov. 1, 2013, now U.S. Pat. No. 9,001,611, which is incorporated herein by reference in its entirety.

BACKGROUND

The semiconductor integrated circuit (IC) industry has produced a wide variety of digital devices to address issues in a number of different areas. Some of these digital devices, such as a system on a chip (SoC) device having a microprocessor, are electrically coupled to static random access memory (SRAM) devices for the storage of digital data, including SRAM register files having more than one port for reading and/or writing data. In a conventional six-transistor (6T) SRAM cell, an issue called half select disturb can affect both read and write operations. Half select disturb affects unselected column memory cells in the same row as a selected column memory cell which degrades SRAM static noise margin and data stability. One approach to addressing half select disturb in a read operation is to use an 8T-SRAM cell which isolates the read port from the bit-line (BL). However, the 8T-SRAM cell still suffers from the half select disturb issue when there is an unselected column cell in the same row as a selected column cell during a write operation. Furthermore, if a simultaneous read operation were to occur to a row being written, a leakage current in the read bit line (BL) can also occur, potentially causing the stored data to be misread. It would be beneficial to mitigate or resolve problems associated with half select disturb.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Conventional memory devices employing eight transistor (8T) static random access memory (SRAM) memory cells having two ports are affected by half select disturb. Note that while 8T SRAM memory cells are described in detail herein, in some embodiments the SRAM memory cells employ a numbers of transistors other than eight, such as six transistor (6T) SRAM memory cells and seven transistor (7T) SRAM. Shrinking device geometries and corresponding decreasing supply voltages have exacerbated the problems associated with half select disturb. In at least some embodiments, one or more of these problems associated with half select disturb are mitigated and/or resolved by a three dimensional (3D) logic array that activates a write word line to one selected SRAM memory cell and prevents activation of write word lines to one or more unselected SRAM memory cells in the same row. By mitigating or resolving issues associated with half select disturb, memory device geometries can continue to shrink.

Figure 1:
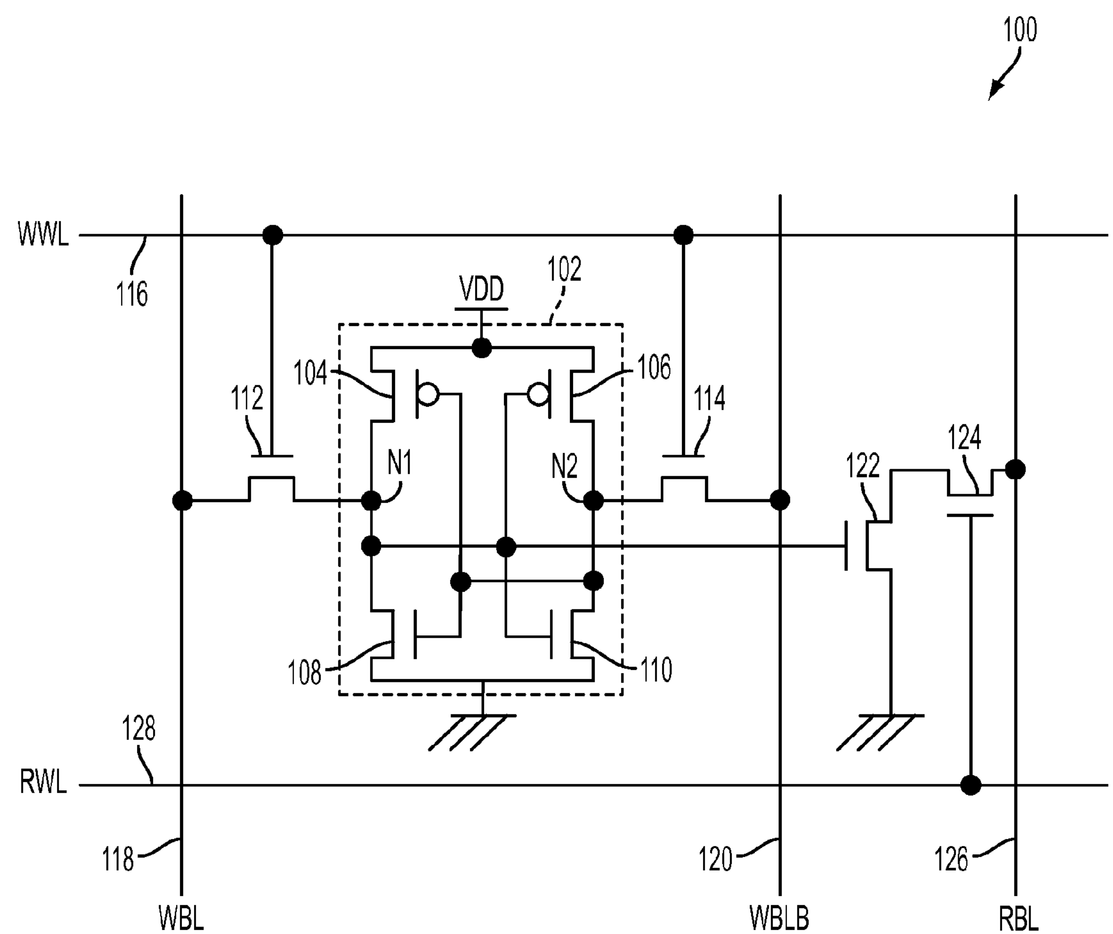
FIG. 1 is a schematic diagram of a memory cell in accordance with one or more embodiments.

FIG. 1 is a schematic diagram of a memory cell 100 in accordance with one or more embodiments. In some embodiments, the memory cell 100 is an eight transistor (8T) static random access memory (SRAM) memory cell. The memory cell 100 includes a pair of cross-coupled inverters 102. The cross-coupled inverters 102 include two p-type metal oxide semiconductor (PMOS) transistors 104, 106 each having source terminals electrically connected to a power supply voltage (VDD) terminal. The two PMOS transistors 104, 106 each have drain terminals separately electrically connected to drain terminals of two n-type metal oxide semiconductor (NMOS) transistors 108, 110 at corresponding nodes N1 and N2. Source terminals of NMOS transistors 108, 110 are electrically connected to ground voltage (VSS). A gate terminal of PMOS transistor 104 is electrically connected to a gate terminal of NMOS transistor 108 and the drain terminal of NMOS transistor 110. Similarly, a gate terminal of PMOS transistor 106 is electrically connected to a gate terminal of NMOS transistor 110 and the drain terminal of NMOS transistor 108.

The memory cell 100 includes a write access NMOS transistor 112 having a source terminal electrically connected to node N1 and a write access NMOS transistor 114 having a source terminal electrically connected to node N2. Gate terminals of write access NMOS transistors 112, 114 are electrically connected to a word write line (WWL) terminal 116. A drain terminal of write access NMOS transistor 112 is electrically connected to a write bit line (WBL) terminal 118. A drain terminal of write access NMOS transistor 114 is electrically connected to a write bit line bar (WBLB) terminal 120. Note that the term "bar" as used in this context indicates a logically inverted signal, for example, WBLB terminal 120 carries a signal logically inverted from a signal carried by WBL terminal 118.

The memory cell 100 includes a read access NMOS transistor 122 having a source terminal electrically connected VSS, a gate terminal electrically connected to node N1 and a drain terminal electrically connected to a source terminal of a read access NMOS transistor 124. Read access NMOS transistor 124 has a drain terminal electrically connected to a read bit line (RBL) terminal 126 and a gate terminal electrically connected to a read word line (RWL) terminal 128. Note that the PMOS and NMOS types of the transistors 104, 106, 108, 110, 112, 114, 122, 124 described above are merely exemplary and in some embodiments, other types of transistors are used in the memory cell 100.

The memory cell 100 has separate write terminals 116, 118, 120 and read terminals 126, 128 that are used to form a two port memory cell array having a write port and a read port. In some embodiments, additional write ports and/or read ports are used.

Figure 2:
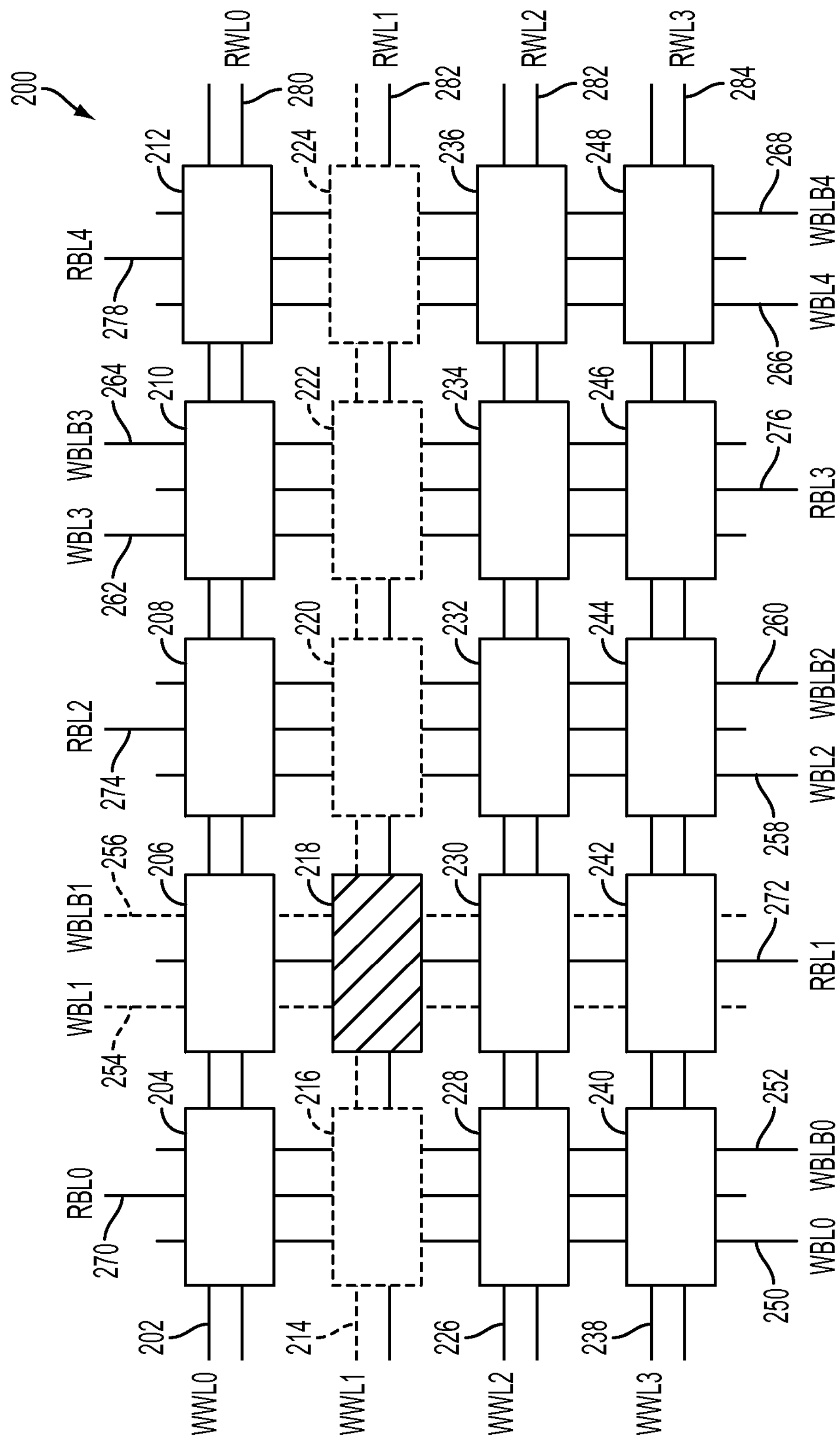
FIG. 2 is a block diagram of a four row by five column representative portion of a memory cell array in accordance with one or more embodiments.

FIG. 2 is a block diagram of a four row by five column representative portion of a memory cell array 200 having two ports in accordance with one or more embodiments. In some embodiments, the memory cell array 200 is part of a three-dimensional, two port register file. Four write word line (WWL) terminals (WWL0-WWL3) carry signals to activate corresponding rows in the memory cell array 200. WWL0 terminal 202 is electrically connected to WWL terminals of memory cells 204, 206, 208, 210, 212 that form row 0 of the memory cell array 200. WWL1 terminal 214 is electrically connected to WWL terminals of memory cells 216, 218, 220, 222, 224 that form row 1 of the memory cell array 200. WWL2 terminal 226 is electrically connected to WWL terminals of memory cells 228, 230, 232, 234, 236 that form row 2 of the memory cell array 200. WWL3 terminal 238 is electrically connected to WWL terminals of memory cells 240, 242, 244, 246, 248 that form row 3 of the memory cell array 200.

Five write bit line (WBL) terminals (WBL0-WBL4) and five write bit line bar (WBLB) terminals (WBLB0-WBLB4) carry data signals for storage in selected memory cells in a column in the memory cell array 200. WBL0 terminal 250 and WBLB0 terminal 252 are electrically connected to the corresponding WBL and WBLB terminals of memory cells 204, 216, 228, 240 that form column 0 of memory cell array 200. WBL1 terminal 254 and WBLB1 terminal 256 are electrically connected to the corresponding WBL and WBLB terminals of memory cells 206, 218, 230, 242 that form column 1 of memory cell array 200. WBL2 terminal 258 and WBLB2 terminal 260 are electrically connected to the corresponding WBL and WBLB terminals of memory cells 208, 220, 232, 244 that form column 2 of memory cell array 200. WBL3 terminal 262 and WBLB3 terminal 264 are electrically connected to the corresponding WBL and WBLB terminals of memory cells 210, 222, 234, 246 that form column 3 of memory cell array 200. WBL4 terminal 266 and WBLB4 terminal 268 are electrically connected to the corresponding WBL and WBLB terminals of memory cells 212, 224, 236, 248 that form column 4 of memory cell array 200.

Five read bit line (RBL) terminals (RBL0-RBL4) carry data signals in selected cells in a column in the memory cell array 200. RBL0 terminal 270 is electrically connected to the RBL terminals of memory cells 204, 216, 228, 240 that form column 0 of memory cell array 200. RBL1 terminal 272 is electrically connected to the RBL terminals of memory cells 206, 218, 230, 242 that form column 1 of memory cell array 200. RBL2 terminal 274 is electrically connected to the RBL terminals of memory cells 208, 220, 232, 244 that form column 2 of memory cell array 200. RBL3 terminal 276 is electrically connected to the RBL terminals of memory cells 210, 222, 234, 246 that form column 3 of memory cell array 200. RBL4 terminal 278 is electrically connected to the RBL terminals of memory cells 212, 224, 236, 248 that form column 4 of memory cell array 200.

Four read word line (RWL) terminals (RWL0-RWL3) are used to activate a row of memory cells in the memory cell array 200. RWL0 terminal 280 is electrically connected to the RWL terminals of row 0 of memory cell array 200. RWL1 terminal 282 is electrically connected to the RWL terminals of row 1 of memory cell array 200. RWL2 terminal 284 is electrically connected to the RWL terminals of row 2 of memory cell array 200. RWL3 terminal 286 is electrically connected to the RWL terminals of row 3 of memory cell array 200.

By way of an illustrative example of half select disturb, a write operation is performed to row 1 that includes memory cells 216, 218, 220, 222, 224 by activating the WWL1 terminal 214. The WBL1 terminal 254 and WBLB1 terminal 256 are also active for receiving data signals and storing a binary bit of data in column 1 that includes memory cells 206, 218, 230, 242. Together, WWL1 terminal 214, WBL1 terminal 254 and WBLB1 terminal 256 select and store a binary bit of data in memory cell 218. During a write operation, a binary bit of data is stored in memory cell 218 by forcing complimentary voltages, either 0 and 1 or 1 and 0, on WWL1 terminal 214 and WBL1 terminal 254, respectively. Access transistors 112 and 114, as shown in FIG. 1, are turned ON by raising the WWL1 terminal 214 to a high voltage. This enables the binary bit of data to be driven into the cross-coupled pair 102, as shown in FIG. 1. The access transistors 112, 114 are then turned OFF and positive feedback of the cross-coupled pair 102, as shown in FIG. 1, ensures that binary bit of data is maintained in memory cell 218.

In this example, memory cell 218 is selected for receiving and storing the binary bit of data because memory cell 218 is the only memory cell in both row 1 and column 1. However, the remaining cells in row 1, activated by the WWL1 terminal 214, are considered to be unselected cells for data writing purposes, but still have their write access gates activated by the WWL1 terminal. Specifically, the unselected cells in row 1 of the memory cell array 200 are memory cells 216, 220, 220, 224. If a read operation overlaps in time the write operation described above and occurs in nearby rows or columns, or in the same row or column, activation of the write access gates in unselected memory cells 216, 220, 220, 224 in row 1 in conjunction with the read operation causes the half select disturb condition. Depending on the spatial and temporal relationship between the write operation and read operation, i.e., how close the cells are in time and distance, the half select disturb condition can cause unnecessary electrical current to be drawn from VDD, cause a miswrite to occur and/or a cause misread to occur, each of which negatively affect the performance of the memory cell array 200.

Figure 3:
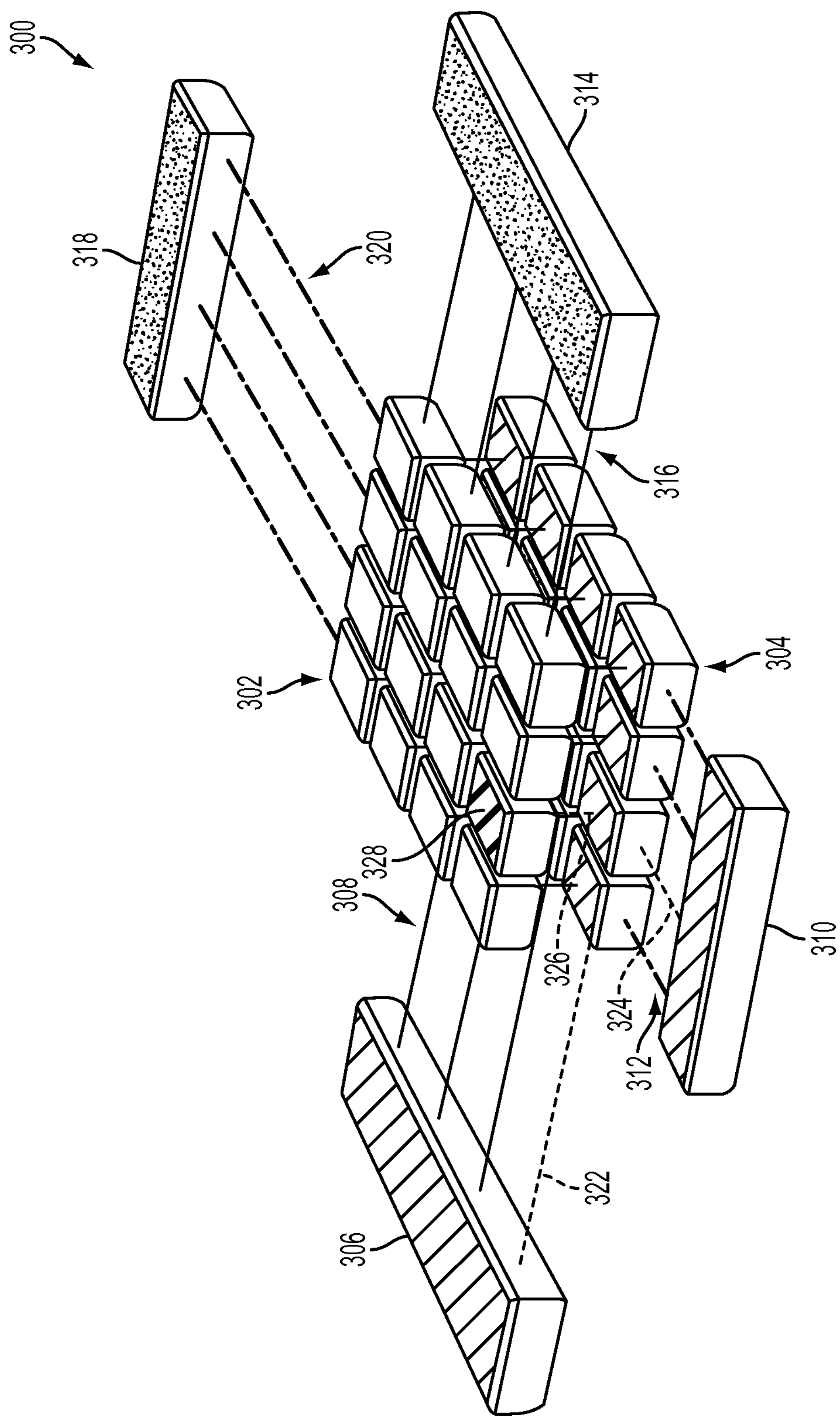
FIG. 3 is a block diagram of a three-dimensional (3D) memory cell array having a separated write logic array in accordance with one or more embodiments.

FIG. 3 is a block diagram of a three-dimensional (3D) memory cell array 300 having a separated write logic array in accordance with one or more embodiments. The 3D memory cell array 300 includes a memory cell array 302. The memory cell array 302 is an array of 8T SRAM memory cells. In some embodiments, the memory cell array 302 is an array of 6T SRAM memory cells. In some embodiments, the 3D memory cell array 300 has greater or fewer number of transistors than other embodiments, e.g., 7T. The memory cell array 302 has two ports, specifically, a read port and a write port. In some embodiments, the memory cell array 302 has more than two ports.

For each memory cell in the memory cell array 302, a corresponding logic gate, such as an AND gate, is electrically connected by an output of the logic gate to the WWL terminal of each memory cell. In some embodiments, the logic gate is selected from one of an AND, NAND, OR and NOR gate. The 3D memory cell array 300 includes an array of the logic gates that is electrically connected to each memory cell in the memory cell array 302 to form a write logic array 304. Each row of memory cells in the memory cell array 302 has a corresponding row of logic gates in the write logic array 304. Each column of memory cells in the memory cell array 302 has a corresponding column of logic gates in the write logic array 304. The write logic array 304 is on a different physical level than the memory cell array 302 in an integrated circuit. As shown in FIG. 3, the write logic array 304 is on a level below that of the level of the memory cell array 302. In some embodiments, the write logic array 304 is on a level above that of the level of the memory cell array 302. In some embodiments, the write logic array 304 is on the same level as the memory cell array 302.

A write address row decoder (WXDEC) 306 receives address information corresponding to a selected row in the memory cell array 302 for writing a binary bit of data. The WXDEC 306 has a separate WXDEC write row output 308 for each row of the write array logic 304. Each of the WXDEC write row outputs 308 are electrically connected to one input terminal of each logic gate in each row in the write logic array 304. A write address column decoder (WYDEC) 310 receives address information corresponding to a selected column in the memory cell array 302 for writing a binary bit of data. The WYDEC 310 has a separate WYDEC write column output 312 for each column of the write array logic 304. Each of the WYDEC write column outputs 312 is electrically connected to another input terminal of each logic gate in each column in the write logic array 304.

A read address row decoder (RXDEC) 314 receives address information corresponding to a selected row in the memory cell array 302 for reading a binary bit of data. The RXDEC 314 has a separate RXDEC read row output 316 for each row in the memory cell array 302. Each of the RXDEC read row outputs 316 are electrically coupled to memory cells in one row in the memory cell array 302. A read address column decoder (RYDEC) 318 receives address information corresponding to a selected column in the memory cell array 302 for reading a binary bit of data. The RYDEC 318 has a separate RYDEC read column output 320 for each column in the memory cell array 302. Each of the RYDEC read column outputs 320 are electrically coupled to memory cells in one column in the memory cell array 302. To read a data bit, one of the RXDEC read row outputs 316 is active and electrically coupled to a RWL terminal of one memory cell and one of the RYDEC read column outputs 320 is active and electrically coupled to a RBL terminal of the same memory cell in the memory cell array 302. Together, read row output signals from the RXDEC 314 and read column output signals from the RYDEC 318 select a single memory cell for reading a binary bit of data.

The logic gates in the write array logic 304, such as AND gates, combine write row output signals received from the WXDEC 306 and write column output signal received from the WYDEC 310 to produce a signal transmitted to the WWL terminal in one selected memory cell in the memory cell array 302. For example, WXDEC write row output 322 and WYDEC write column output 324 are logically ANDed together in the write logic array 304 to produce a signal electrically connected to WWL 326 to activate memory cell 328 for writing a binary bit of data. The write logic array 304 uses signals from the WXDEC 306 and the WYDEC 310 to select and activate a single memory cell for writing a binary bit of data. In this manner, the write array logic 304 in the 3D memory cell array 300 selects and activates only one memory cell in a row instead of activating each WWL terminal for the entire row of selected and unselected memory cells. Because only one memory cell is activated by the WWL signal in the 3D memory cell array 300, instead of an entire row of memory cells, some problems associated with the half select disturb condition are mitigated or eliminated.

Figure 4:
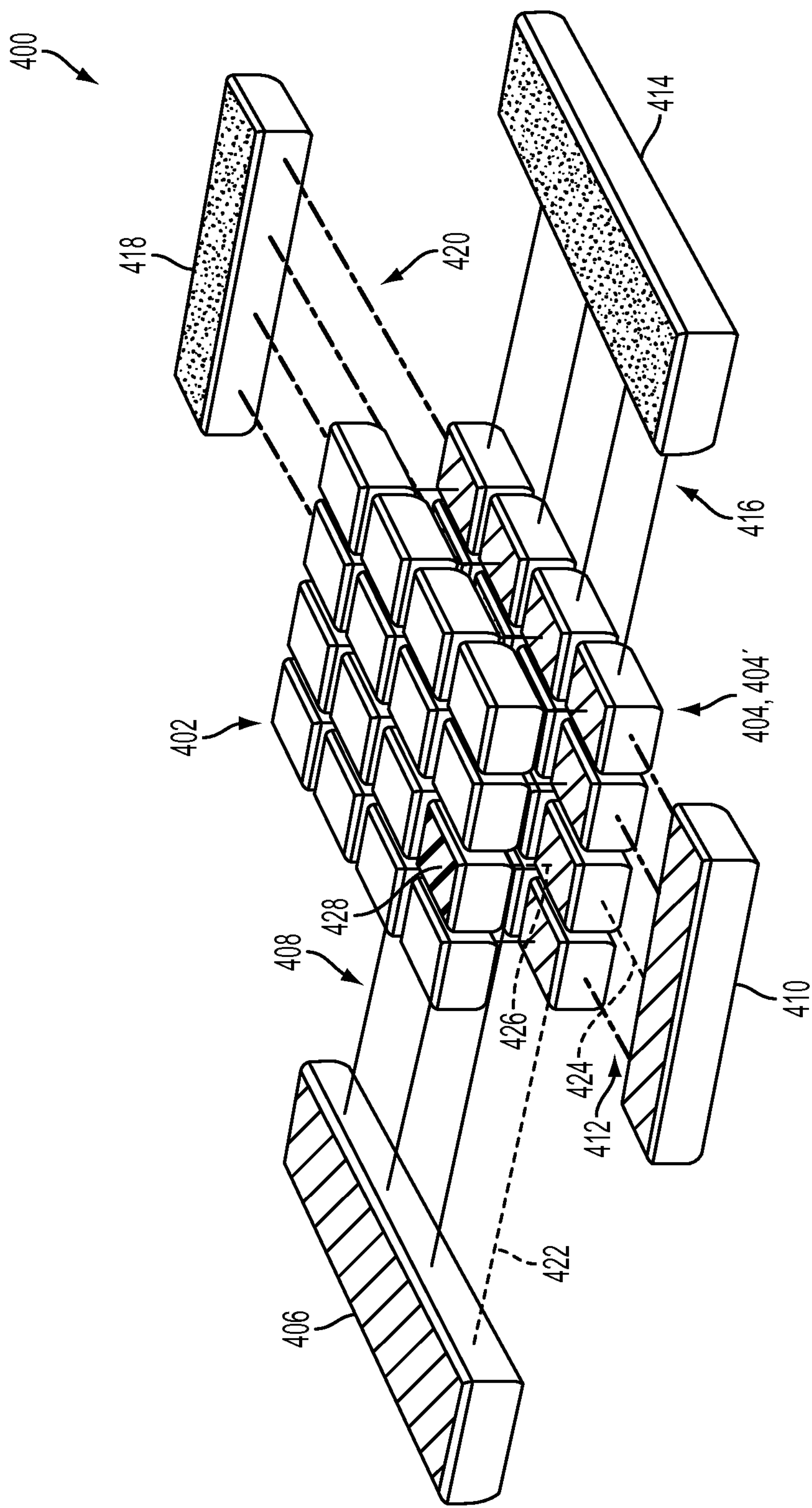
FIG. 4 is a block diagram of a 3D memory cell array having a separated write logic array sharing space with a separated read logic array in accordance with one or more embodiments.

FIG. 4 is a block diagram of a 3D memory cell array 400 having a separated write logic array sharing space with a separated read logic array in accordance with one or more embodiments. The 3D memory cell array 400 includes a memory cell array 402. The memory cell array 402 is an array of 8T SRAM memory cells. In some embodiments, the memory cell array 402 is an array of 6T SRAM memory cells. In some embodiments, the 3D memory cell array 400 has greater or fewer number of transistors than other embodiments, e.g., 7T. The memory cell array 402 has two ports, specifically, a read port and a write port. In some embodiments, the memory cell array 402 has more than two ports.

For each memory cell in the memory cell array 402, a corresponding logic gate, such as an AND gate, is electrically connected by an output of the logic gate to the WWL terminal of each memory cell. In some embodiments, the logic gate is selected from one of an AND, NAND, OR and NOR gate. The 3D memory cell array 400 includes an array of the logic gates that is electrically connected to each memory cell in the memory cell array 402 to form a write logic array 404. Each row of memory cells in the memory cell array 402 has a corresponding row of logic gates in the write logic array 404. Each column of memory cells in the memory cell array 402 has a corresponding column of logic gates in the write logic array 404. The write logic array 404 is on a different physical level than the memory cell array 402 in an integrated circuit. As shown in FIG. 4, the write logic array 404 is on a level below that of the level of the memory cell array 402. In some embodiments, the write logic array 404 is on a level above that of the level of the memory cell array 402. In some embodiments, the write logic array 404 is on the same level as the memory cell array 402.

For each memory cell in the memory cell array 402, another corresponding logic gate, such as an AND gate, is electrically connected by an output of the logic gate to the RWL terminal of each memory cell. In some embodiments, the logic gate is selected from one of an AND, NAND, OR and NOR gate. The 3D memory cell array 400 includes an array of the logic gates that is electrically connected to each memory cell in the memory cell array 402 to form a read logic array 404'. As illustrated in FIG. 4, the write logic array 404 shares space with the read logic array 404'. In some embodiments, the logic gates of the write logic array 404 alternate and are evenly interspersed with the logic gates of the read logic array 404' and share space on the same physical level. Each row of memory cells in the memory cell array 402 has a corresponding row of logic gates in the read logic array 404'. Each column of memory cells in the memory cell array 402 has a corresponding column of logic gates in the read logic array 404'. The read logic array 404' is on a different physical level than the memory cell array 402 in an integrated circuit. As shown in FIG. 4, the write logic array 404 shares space with the read logic array 404' on a level below that of the level of the memory cell array 402. In some embodiments, the write logic array 404 and the read logic array 404' are on a level above that of the level of the memory cell array 402. In some embodiments, the write logic array 404 and read logic array 404' are on the same level as the memory cell array 402.

A write address row decoder (WXDEC) 406 receives address information corresponding to a selected row in the memory cell array 402 for writing a binary bit of data. The WXDEC 406 has a separate WXDEC write row output 408 for each row of the write array logic 404. Each of the WXDEC write row outputs 408 are electrically connected to one input terminal of each logic gate in each row in the write logic array 404. A write address column decoder (WYDEC) 410 receives address information corresponding to a selected column in the memory cell array 402 for writing a binary bit of data. The WYDEC 410 has a separate WYDEC write column output 412 for each column of the write array logic 404. Each of the WYDEC write column outputs 412 is electrically connected to another input terminal of each logic gate in each column in the write logic array 404.

A read address row decoder (RXDEC) 414 receives address information corresponding to a selected row in the memory cell array 402 for reading a binary bit of data. The RXDEC 414 has a separate RXDEC read row output 416 for each row in the memory cell array 402. Each of the RXDEC read row outputs 416 are electrically connected to one input terminal of each logic gate in each row in the read logic array 404'. A read address column decoder (RYDEC) 418 receives address information corresponding to a selected column in the memory cell array 402 for reading a binary bit of data. The RYDEC 418 has a separate RYDEC read column output 420 for each column in the memory cell array 402. Each of the RYDEC read column outputs 420 are electrically connected to another input terminal of each logic gate in each column in the read logic array 404'. To read a data bit, one of the RXDEC read row outputs 416 is active and electrically coupled to a RWL terminal of one memory cell and one of the RYDEC read column outputs 416 is active and electrically coupled to a RBL terminal of the same memory cell in the memory cell array 402. Together, read row output signals from the RXDEC 414 and read column output signals from the RYDEC 418 select a single memory cell for reading a binary bit of data. The logic gates in the read array logic 404', such as AND gates, combine read row output signals received from the RXDEC 414 and read column output signals received from the RYDEC 418 to produce a signal transmitted to the RWL terminal in one selected memory cell in the memory cell array 402. The read logic array 404' uses signals from the RXDEC 414 and the RYDEC 418 to select and activate a single memory cell for reading a binary bit of data. In this manner, the read array logic 404' in the 3D memory cell array 400 selects and activates only one memory cell in a row instead of activating each RWL terminal for the entire row of selected and unselected memory cells. Because only one memory cell is activated by the RWL signal in the 3D memory cell array 400, instead of an entire row of memory cells, some problems associated with the half select disturb condition are mitigated or eliminated.

The logic gates in the write array logic 404, such as AND gates, combine write row output signals received from the WXDEC 406 and write column output signals received from the WYDEC 410 to produce a signal transmitted to the WWL terminal in one selected memory cell in the memory cell array 402. For example, WXDEC write row output 422 and WYDEC write column output 424 are logically ANDed together in the write logic array 404 to produce a signal electrically connected to WWL 426 to activate memory cell 428 for writing a binary bit of data. The write logic array 404 uses signals from the WXDEC 406 and the WYDEC 410 to select and activate a single memory cell for writing a binary bit of data. In this manner, the write array logic 404 in the 3D memory cell array 400 selects and activates only one memory cell in a row instead of activating each WWL terminal for the entire row of selected and unselected memory cells. Because only one memory cell is activated by the WWL signal in the 3D memory cell array 400, instead of an entire row of memory cells, some problems associated with the half select disturb condition are mitigated or eliminated.

Figure 5:
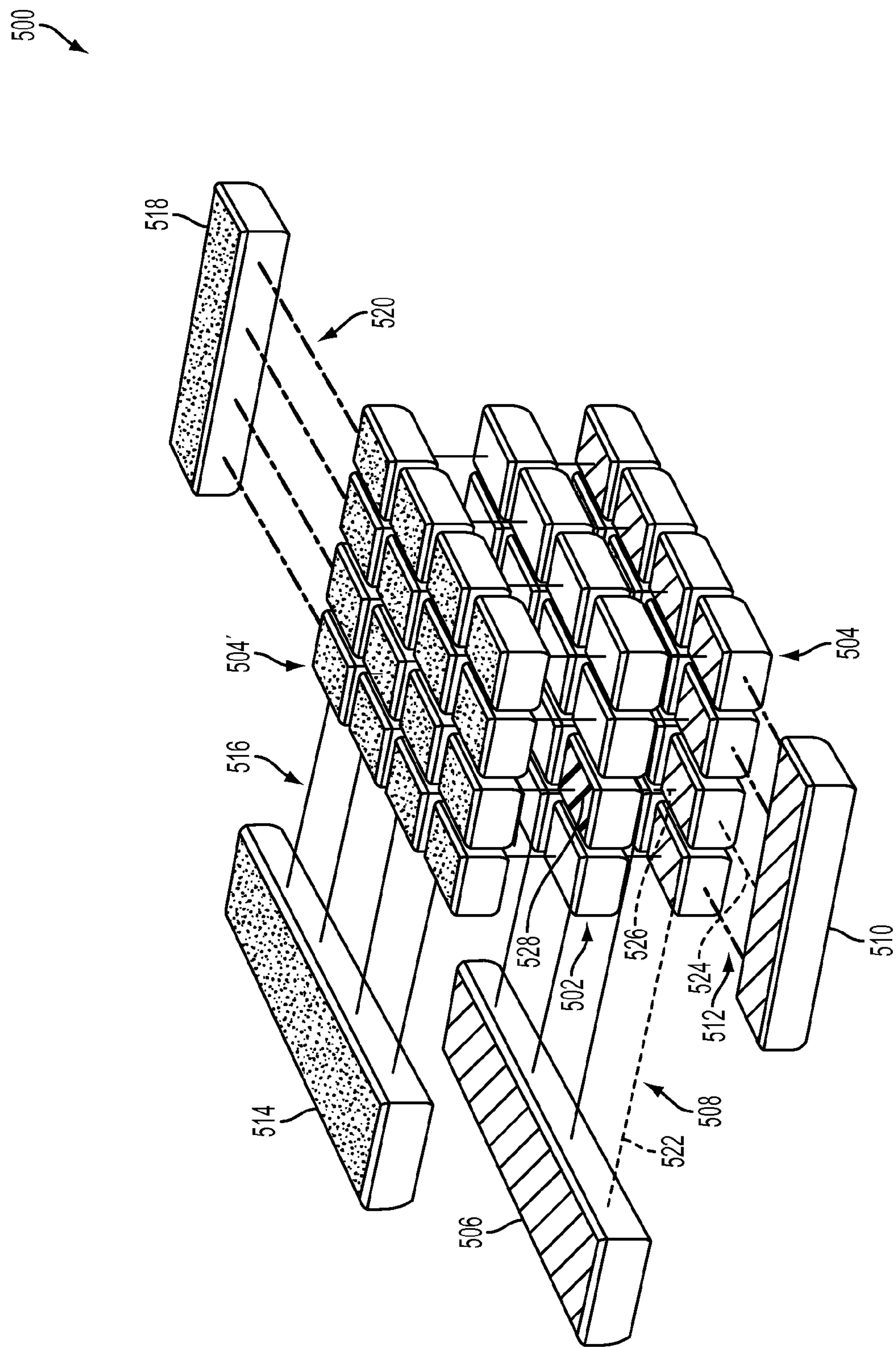
FIG. 5 is a block diagram of a 3D memory cell array having a separated write logic array and a separated read logic array in accordance with one or more embodiments.

FIG. 5 is a block diagram of a 3D memory cell array 500 having a separated write logic array and a separated read logic array in accordance with one or more embodiments. The 3D memory cell array 500 includes a memory cell array 502. The memory cell array 502 is an array of 8T SRAM memory cells. In some embodiments, the memory cell array 502 is an array of 6T SRAM memory cells. In some embodiments, the 3D memory cell array 500 has greater or fewer number of transistors than other embodiments, e.g., 7T. The memory cell array 502 has two ports, specifically, a read port and a write port. In some embodiments, the memory cell array 502 has more than two ports.

For each memory cell in the memory cell array 502, a corresponding logic gate, such as an AND gate, is electrically connected by an output of the logic gate to the WWL terminal of each memory cell. In some embodiments the logic gate is selected from one of an AND, NAND, OR and NOR gate. The 3D memory cell array 500 includes an array of the logic gates that is electrically connected to each memory cell in the memory cell array 502 to form a write logic array 504. Each row of memory cells in the memory cell array 502 has a corresponding row of logic gates in the write logic array 504. Each column of memory cells in the memory cell array 502 has a corresponding column of logic gates in the write logic array 504. The write logic array 504 is on a different physical level than the memory cell array 502 in an integrated circuit. As shown in FIG. 5, the write logic array 504 is on a level below that of the level of the memory cell array 502. In some embodiments, the write logic array 504 is on a level above that of the level of the memory cell array 502. In some embodiments, the write logic array 504 is on the same level as the memory cell array 502.

For each memory cell in the memory cell array 502, another corresponding logic gate, such as an AND gate, is electrically connected by an output of the logic gate to the RWL terminal of each memory cell. In some embodiments the logic gate is selected from one of an AND, NAND, OR and NOR gate. The 3D memory cell array 500 includes an array of the logic gates that is electrically connected to each memory cell in the memory cell array 502 to form a read logic array 504'. As illustrated in FIG. 5, the read logic array 504' is above the memory cell array 502 and the memory cell array is above the write logic array 504. In some embodiments, the read logic array 504' is below the memory cell array 502 and the memory cell array is below the write logic array 504. Each row of memory cells in the memory cell array 502 has a corresponding row of logic gates in the read logic array 504'. Each column of memory cells in the memory cell array 502 has a corresponding column of logic gates in the read logic array 504'. The read logic array 504' is on a different physical level than the memory cell array 502 in an integrated circuit. In some embodiments, the read logic array 504' is on the same physical level as the memory cell array 502 in an integrated circuit.

A write address row decoder (WXDEC) 506 receives address information corresponding to a selected row in the memory cell array 502 for writing a binary bit of data. The WXDEC 506 has a separate WXDEC write row output 508 for each row of the write array logic 504. Each of the WXDEC write row outputs 508 are electrically connected to one input terminal of each logic gate in each row in the write logic array 504. A write address column decoder (WYDEC) 510 receives address information corresponding to a selected column in the memory cell array 502 for writing a binary bit of data. The WYDEC 510 has a separate WYDEC write column output 512 for each column of the write array logic 504. Each of the WYDEC write column outputs 512 is electrically connected to another input terminal of each logic gate in each column in the write logic array 504.

A read address row decoder (RXDEC) 514 receives address information corresponding to a selected row in the memory cell array 502 for reading a binary bit of data. The RXDEC 514 has a separate RXDEC read row output 516 for each row in the memory cell array 502. Each of the RXDEC read row outputs 516 are electrically connected to one input terminal of each logic gate in each row in the read logic array 504'. A read address column decoder (RYDEC) 518 receives address information corresponding to a selected column in the memory cell array 502 for reading a binary bit of data. The RYDEC 518 has a separate RYDEC read column output 520 for each column in the memory cell array 502. Each of the RYDEC read column outputs 520 are electrically connected to another input terminal of each logic gate in each column in the read logic array 504'.

The logic gates in the read array logic 504', such as AND gates, combine read row output signals received from the RXDEC 514 and read column output signals received from the RYDEC 518 to produce a signal transmitted to the RWL terminal in one selected memory cell in the memory cell array 502. The read logic array 504' uses signals from the RXDEC 514 and the RYDEC 518 to select and activate a single memory cell for reading a binary bit of data. Together, read row output signals from the RXDEC 514 and read column output signals from the RYDEC 518 select a single memory cell for reading a binary bit of data.

The logic gates in the write array logic 504, such as AND gates, combine write row output signals received from the WXDEC 506 and write row output signals received from the WYDEC 510 to produce a signal transmitted to the WWL terminal in one selected memory cell in the memory cell array 502. For example, WXDEC write row output 522 and WYDEC write row output 524 are logically ANDed together in the write logic array 504 to produce a signal electrically connected to WWL 526 to activate memory cell 528 for writing a binary bit of data. The write logic array 504 uses signals from the WXDEC 506 and the WYDEC 510 to select and activate a single memory cell for writing a binary bit of data. In this manner, the write array logic 504 in the 3D memory cell array 500 selects and activates only one memory cell in a row instead of activating each WWL terminal for the entire row of selected and unselected memory cells. Because only one memory cell is activated by the WWL signal in the 3D memory cell array 500, instead of an entire row of memory cells, some problems associated with the half select disturb condition are mitigated or eliminated.

In the embodiments described herein, other SRAM peripheral logic such as other control logic, input/output (I/O) logic, sense amplifier (SA) logic, is not limited to any particular level and may be above, below, left or right of the logic described herein such as the memory cell array 302, 402, 502, WXDEC 306, 406, 506, WYDEC 310, 410, 510, RXDEC 314, 414, 514 and RYDEC 318, 418, 518.

An aspect of this description relates to a method that comprises selecting a memory cell included in a memory cell array in which data is to be stored. The memory cell array is connected with a logic gate array. The memory cells of the memory cell array are individually coupled with a corresponding logic gate of the logic gate array by a separate word line output. The method also comprises communicating a write row output signal to the logic gate array. The write row output signal is communicated from a write address row decoder to the logic gate array. The write address row decoder has a plurality of write row outputs coupled with the logic gate array. The method further comprises communicating a write column output signal to the logic gate array. The write column output signal is communicated from a write address column decoder to the logic gate array. The write address column decoder has a plurality of write column outputs coupled with the logic gate array.

Another aspect of this description relates to a method that comprises selecting a memory cell included in a memory cell array in which data is to be stored. The memory cell array is connected with a write logic gate array and with a read logic gate array. The memory cells of the memory cell array are individually coupled with a corresponding write logic gate of the write logic gate array by a separate write word line output. The memory cells of the memory cell array are individually coupled with a corresponding read logic gate of the read logic gate array by a separate read word line output. The method also comprises communicating a write row output signal to the logic gate array. The write row output signal is communicated from a write address row decoder to the write logic gate array. The write address row decoder has a plurality of write row outputs coupled with the write logic gate array. The method further comprises communicating a write column output signal to the logic gate array. The write column output signal is communicated from a write address column decoder to the write logic gate array. The write address column decoder has a plurality of write column outputs coupled with the write logic gate array. The method additionally comprises selecting a memory cell included in the memory cell array from which data is to be read. The method also comprises communicating a read row output signal to the read logic gate array. The read row output signal is communicated from a read address row decoder to the logic gate array. The read address row decoder has a plurality of read row outputs coupled with the logic gate array. The method further comprises communicating a read column output signal to the read logic gate array. The read column output signal is communicated from a read address column decoder to the read logic gate array. The read address column decoder has a plurality of read column outputs coupled with the read logic gate array.

A further aspect of this description relates to a method that comprises selecting a memory cell included in a memory cell array in which data is to be stored. The memory cell array is connected with a write logic gate array and with a read logic gate array. The memory cells of the memory cell array are individually coupled with a corresponding write logic gate of the write logic gate array by a separate write word line output. The memory cells of the memory cell array are individually coupled with a corresponding read logic gate of the read logic gate array by a separate read word line output. The method also comprises communicating a write row output signal to the logic gate array. The write row output signal is communicated from a write address row decoder to the write logic gate array. The write address row decoder has a plurality of write row outputs coupled with the write logic gate array. The method further comprises communicating a write column output signal to the logic gate array. The write column output signal is communicated from a write address column decoder to the write logic gate array. The write address column decoder has a plurality of write column outputs coupled with the write logic gate array. The method additionally comprises selecting a memory cell included in the memory cell array from which data is to be read. The method also comprises communicating a read row output signal to the read logic gate array. The read row output signal is communicated from a read address row decoder to the logic gate array. The read address row decoder has a plurality of read row outputs coupled with the logic gate array. The method further comprises communicating a read column output signal to the read logic gate array. The read column output signal is communicated from a read address column decoder to the read logic gate array. The read address column decoder has a plurality of read column outputs coupled with the read logic gate array. The memory cell array is on a first level, the write logic gate array is on a second level different from the first level, and the read logic gate array is on the second level or a third level different from the first level and the second level.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method, comprising:

selecting a memory cell included in a memory cell array in which data is to be stored, wherein the memory cell array is connected with a logic gate array, and the memory cells of the memory cell array are individually coupled with a corresponding logic gate of the logic gate array by a separate word line output;

communicating a write row output signal to the logic gate array, the write row output signal being communicated from a write address row decoder to the logic gate array, wherein the write address row decoder has a plurality of write row outputs coupled with the logic gate array; and communicating a write column output signal to the logic gate array, the write column output signal being communicated from a write address column decoder to the logic gate array, wherein the write address column decoder has a plurality of write column outputs coupled with the logic gate array.

2. The method of claim 1, wherein the memory cell array is on a first level, the logic gate array is on a second level, and the first level is different from the second level.

3. The method of claim 2, wherein the first level is above the second level.

4. The method of claim 2, wherein the write address row decoder and the write address column decoder are on a level different from the first level.

5. The method of claim 1, further comprising:

selecting a memory cell included in the memory cell array from which data is to be read, communicating a read row output signal to the logic gate array, the read row output signal being communicated from a read address row decoder to the logic gate array, wherein the read address row decoder has a plurality of read row outputs coupled with the logic gate array; and communicating a read column output signal to the logic gate array, the read column output signal being communicated from a read address column decoder to the logic gate array, wherein the read address column decoder has a plurality of read column outputs coupled with the logic gate array.

6. The method of claim 5, wherein the logic gate array comprises a first logic gate array and a second logic gate array, the first logic gate array is coupled with the write address row decoder and with the write address column decoder, the second logic gate array is coupled with the read row address decoder and with the read column address decoder, the separate word line outputs individually coupling the memory cells of the memory cell array with the first logic gate array are write word line outputs, and the separate word line outputs individually coupling the memory cells of the memory cell array with the second logic gate array are read word line outputs.

7. The method of claim 6, wherein the memory cell array is on a first level, the first logic gate array is on a second level different from the first level, and the second logic gate array is on a third level different from the first level and different from the second level.

8. The method of claim 7, wherein the write address row decoder and the write address column decoder are on the second level, and the read address row decoder and the read address column decoder are on the third level.

9. A method, comprising:

selecting a memory cell included in a memory cell array in which data is to be stored, wherein the memory cell array is connected with a write logic gate array and with a read logic gate array, the memory cells of the memory cell array are individually coupled with a corresponding write logic gate of the write logic gate array by a separate write word line output, and the memory cells of the memory cell array are individually coupled with a corresponding read logic gate of the read logic gate array by a separate read word line output;

communicating a write row output signal to the logic gate array, the write row output signal being communicated from a write address row decoder to the write logic gate array, wherein the write address row decoder has a plurality of write row outputs coupled with the write logic gate array;

communicating a write column output signal to the logic gate array, the write column output signal being communicated from a write address column decoder to the write logic gate array, wherein the write address column decoder has a plurality of write column outputs coupled with the write logic gate array;

selecting a memory cell included in the memory cell array from which data is to be read, communicating a read row output signal to the read logic gate array, the read row output signal being communicated from a read address row decoder to the logic gate array, wherein the read address row decoder has a plurality of read row outputs coupled with the logic gate array; and communicating a read column output signal to the read logic gate array, the read column output signal being communicated from a read address column decoder to the read logic gate array, wherein the read address column decoder has a plurality of read column outputs coupled with the read logic gate array.

10. The method of claim 9, wherein the memory cell array is on a first level, and at least one of the write logic gate array or the read logic gate array is on another level different from the first level.

11. The method of claim 9, wherein the write logic gate array is on a second level over the first level.

12. The method of claim 11, wherein the write address row decoder is on the second level.

13. The method of claim 11, wherein the read write address column decoder is on the second level.

14. The method of claim 9, wherein the read logic gate array in on a second level over the first level.

15. The method of claim 14, wherein the read address row decoder is on the second level.

16. The method of claim 14, wherein the read address column decoder is on the second level.

17. A method, comprising:

selecting a memory cell included in a memory cell array in which data is to be stored, wherein the memory cell array is connected with a write logic gate array and with a read logic gate array, the memory cells of the memory cell array are individually coupled with a corresponding write logic gate of the write logic gate array by a separate write word line output, and the memory cells of the memory cell array are individually coupled with a corresponding read logic gate of the read logic gate array by a separate read word line output;

communicating a write row output signal to the logic gate array, the write row output signal being communicated from a write address row decoder to the write logic gate array, wherein the write address row decoder has a plurality of write row outputs coupled with the write logic gate array;

communicating a write column output signal to the logic gate array, the write column output signal being communicated from a write address column decoder to the write logic gate array, wherein the write address column decoder has a plurality of write column outputs coupled with the write logic gate array;

selecting a memory cell included in the memory cell array from which data is to be read, communicating a read row output signal to the read logic gate array, the read row output signal being communicated from a read address row decoder to the logic gate array, wherein the read address row decoder has a plurality of read row outputs coupled with the logic gate array; and communicating a read column output signal to the read logic gate array, the read column output signal being communicated from a read address column decoder to the read logic gate array, wherein the read address column decoder has a plurality of read column outputs coupled with the read logic gate array, wherein the memory cell array is on a first level, the write logic gate array is on a second level different from the first level, and the read logic gate array is on the second level or a third level different from the first level and the second level.

18. The method of claim 17, wherein the third level is above the first level and the first level is above the second level.

19. The method of claim 17, wherein the write address row decoder is on the second level, and the write address column decoder is on the second level.

20. The method of claim 17, wherein the read address row decoder is on the third level, and the read address column decoder is on the third level.

* * * * *